(12) United States Patent
Takeuchi

(10) Patent No.: US 7,697,118 B2
(45) Date of Patent: Apr. 13, 2010

(54) SEMICONDUCTOR DEVICE MANUFACTURING METHOD AND APPARATUS USED IN THE SEMICONDUCTOR DEVICE MANUFACTURING METHOD

(75) Inventor: Kenichi Takeuchi, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 829 days.

(21) Appl. No.: 11/492,931

(22) Filed: Jul. 26, 2006

(65) Prior Publication Data

US 2006/0263932 A1      Nov. 23, 2006

Related U.S. Application Data

(62) Division of application No. 11/129,292, filed on May 16, 2005, now Pat. No. 7,105,457.

(30) Foreign Application Priority Data

Aug. 24, 2004   (JP) .............................. 2004-243832

(51) Int. Cl.
   *G03B 27/58*  (2006.01)
   *H01L 21/00*  (2006.01)
(52) U.S. Cl. ............................. 355/74; 438/106; 355/72
(58) Field of Classification Search .................. 355/30, 355/53, 72, 75, 76, 74; 378/34, 35; 310/10, 310/12; 438/106
See application file for complete search history.

(56) References Cited

U.S. PATENT DOCUMENTS 5,544,213 A *  8/1996  Chiba et al. ................... 378/34
5,858,587 A *  1/1999  Yamane et al. ................ 430/22
6,093,577 A     7/2000  Van der Groen et al.
2004/0159997 A1* 8/2004 Han et al. ..................... 269/296

FOREIGN PATENT DOCUMENTS

JP      2-114628       4/1990
JP      2001-156093    6/2001

* cited by examiner

*Primary Examiner*—Alan A Mathews
*Assistant Examiner*—Mesfin T Asfaw
(74) *Attorney, Agent, or Firm*—Rabin & Berdo, PC

(57) ABSTRACT

A semiconductor device manufacturing method includes forming circuit devices and a plurality of electrode pads within a semiconductor chip formation region. The method also includes forming, on the main surface of the semiconductor wafer, an insulating film which exposes a portion of each of the electrode pads. The method also includes forming a conducting film covering the electrode pads, on the insulating film, and forming a wiring layer on the conducting film. The method also includes forming a negative resist layer in the semiconductor chip formation region and a peripheral region. The method also includes covering protruding electrode formation regions in the semiconductor chip formation region and covering electrode portion formation regions in the peripheral region, and performing optical exposure of the negative resist layer. The method also includes forming aperture portions in the protruding electrode formation regions and a plurality of electrode portions. The aperture portions expose a portion of the wiring layer. The electrode portions are formed by exposing the conducting film. The method also includes performing plating using the resist layer as a mask to form protruding electrodes.

16 Claims, 9 Drawing Sheets

SEMICONDUCTOR DEVICE MANUFACTURING METHOD AND APPARATUS USED IN THE SEMICONDUCTOR DEVICE MANUFACTURING METHOD

This is a Divisional of U.S. application Ser. No. 11/129,292, filed May 16, 2005 now U.S. Pat. No. 7,105,457, the subject matter of which is incorporated herein by reference.

BACKGROUND OF THE INVENTION

1. Field of the Invention

This invention relates to a method of manufacturing a semiconductor device having a so-called WCSP (Wafer-Level Chip Size Package) structure, and to a manufacturing apparatus used in this manufacturing method, in particular to an optical exposure apparatus.

2. Description of the Related Art

A package having a size equal to a single semiconductor chip cut from the semiconductor wafer is generally known as a CSP (Chip-Size Package). The CSP obtained when resin sealing is applied over a semiconductor chip formed on a semiconductor wafer in the semiconductor wafer state is called a WCSP.

A WCSP is obtained by separation of a structure which includes a plurality of semiconductor devices formed in a matrix on a semiconductor wafer using wafer processes.

In a WCSP manufacturing process, when forming protruding electrodes (also called electrode posts), for example a negative resist material is used to form a resist pattern for a plating process over the entire wafer surface on which a rewiring layer is formed. In this resist pattern for a plating process, aperture portions are formed at positions at which protruding electrodes are to be formed. Those regions on the negative resist material (resist layer) which are not optically exposed by the exposure apparatus are removed to form aperture portions. Thus, the optical exposure process is performed using a mask to shield those regions on the resist layer in which protruding electrodes are to be formed.

Semiconductor devices are not formed along the periphery of the wafer. In the optical exposure process, a light shielding layer is formed covering the entire periphery of the wafer. After the optical exposure process, the UBM (Under Barrier Metal) layer (hereafter also simply called the conducting layer) in the peripheral region is caused to be exposed on the surface. Such technology is for example disclosed in Japanese Patent Kokai (Laid-open Application) No. 2001-156093.

There is another known technology. In order to expand the usable area of the wafer, optical exposure is applied on a peripheral region of positive resist provided on the entire wafer surface (see for example Japanese Patent Kokai No. 2-114628). As a result, there exists a contact portion in the peripheral region which is in contact with retaining claws used to hold the wafer, and the contact portion is also optically exposed.

As described above, in the conventional WCSP manufacturing methods the entirety of the wafer peripheral portion is optically exposed, so that the UBM film (conductive film) exposed at the surface in the wafer peripheral region is also plated in the protruding electrode formation process (plating process). In the plating process, the conductive film must be exposed at the surface as an electrode portion in the wafer peripheral region because it has to be electrically connected with the plating equipment. However, when a conductive film is exposed at the surface over the entire peripheral region, plating material is wasted in the plated film formed over the entire conductive film.

As disclosed in Japanese Patent Kokai No. 2-114628, if a mask is formed and a special optical exposure process is used to optically expose only the peripheral portion of the wafer, that is, if the process of forming the electrode portion for the plating process is a separate process, then the number of processes is increased. As a result, there tends to be an increase in the semiconductor device manufacturing costs.

Further, in the peripheral region near the outer perimeter of the semiconductor wafer, if the area of the UBM film exposed at the surface becomes large, there creates the possibility that a plated film may be formed in this region. When for example retaining the semiconductor wafer during the sealing process, stresses are concentrated in the region in which this plated film appears. This would result in damage to the semiconductor wafer.

SUMMARY OF THE INVENTION

One object of this invention is to provide a manufacturing method for WCSPs capable of forming electrodes for use in a wafer peripheral portion plating process with a very small area, without using special processes.

Another object of the present invention is to provide a manufacturing apparatus suitable for this manufacturing method.

According to a first aspect of the present invention, there is provided a semiconductor device manufacturing method that includes the following processes.

First, a semiconductor chip formation region and a peripheral region surrounding the semiconductor chip formation region are defined on the main surface of the semiconductor wafer.

Next, circuit elements and a plurality of electrode pads for connection to the circuit elements are formed within the semiconductor chip formation region.

Then, an insulating film, which leaves a portion of each of the electrode pads exposed, is formed on the main surface of the semiconductor wafer.

Then, a conducting film covering the electrode pads is formed on the insulating film. Thereafter, a wiring layer to electrically connect circuit element connection pads is formed on the conducting film.

Next, a negative resist layer is formed on the wiring layer and the peripheral region.

Then, the negative resist layer is optically exposed and patterned, using a shielding layer to optically shield protruding electrode formation regions on the wiring layer in the semiconductor chip formation region, and using an optical exposure apparatus having an electrode blind which optically shields a plurality of electrode formation regions in the peripheral region. Thus, aperture portions are provided in the protruding electrode formation regions. The aperture portions expose a portion of the wiring layer. A plurality of electrode portions are also formed as a result of exposing the conducting film.

Then, the resist layer having patterned aperture portions is used as a mask in a plating process, to form protruding electrodes in the protruding electrode formation regions.

By this semiconductor device manufacturing method, the electrode portions used in a plating process to form the protruding electrodes can be formed without performing a special process, so that the number of manufacturing processes can be reduced. Further, the area of the conducting film exposed from the entire wafer peripheral region can be reduced, so that the amount of plating material used can be decreased. This contributes to substantial reduction of manufacturing costs.

In addition, by reducing the area of the conducting layer which is exposed at the surface as an electrode portion, the plating process can be performed in a state in which the electrode portion is more reliably protected (sealed). That is, a plated film is not formed on this electrode portion, so that in for example a sealing process or similar which follows the plating process, there is no longer danger of damage to the semiconductor wafer. Hence the yield of manufactured semiconductor devices can be improved.

According to a second aspect of the present invention, there is provided an optical exposure apparatus that includes an XY-axis driven stage and a platen provided on the XY-axis driven stage for holding a semiconductor wafer. The optical exposure apparatus also includes a driving ring, in a closed-loop shape. The driving ring can rotate about the center point of the closed loop. The optical exposure apparatus also includes a plurality of electrode blinds, connected to the driving ring and to the XY-axis driven stage. These electrode blinds can move between a first position and a second position upon rotation of the driving ring. When the electrode blinds are in the first position, placement and removal of the semiconductor wafer onto and from the platen are possible. When the electrode blinds are in the second position, each electrode blind covers a portion of the peripheral region of the semiconductor wafer placed on the platen.

By means of such an exposure apparatus, the wafer is retained in the optical exposure process, and optical exposure of the resist layer can be performed to form the electrode portions which will be used in the plating process. That is, by using the optical exposure apparatus of this invention, the electrode blinds of the exposure apparatus are used as masks to perform optical exposure in order to form the electrode portions. Thus, the number of processes for WCSP manufacture can be reduced, and the above-described manufacturing processes can be executed by means of simple processes. This greatly reduces the manufacturing costs of semiconductor devices.

DETAILED DESCRIPTION OF THE INVENTION

Figure 1A:
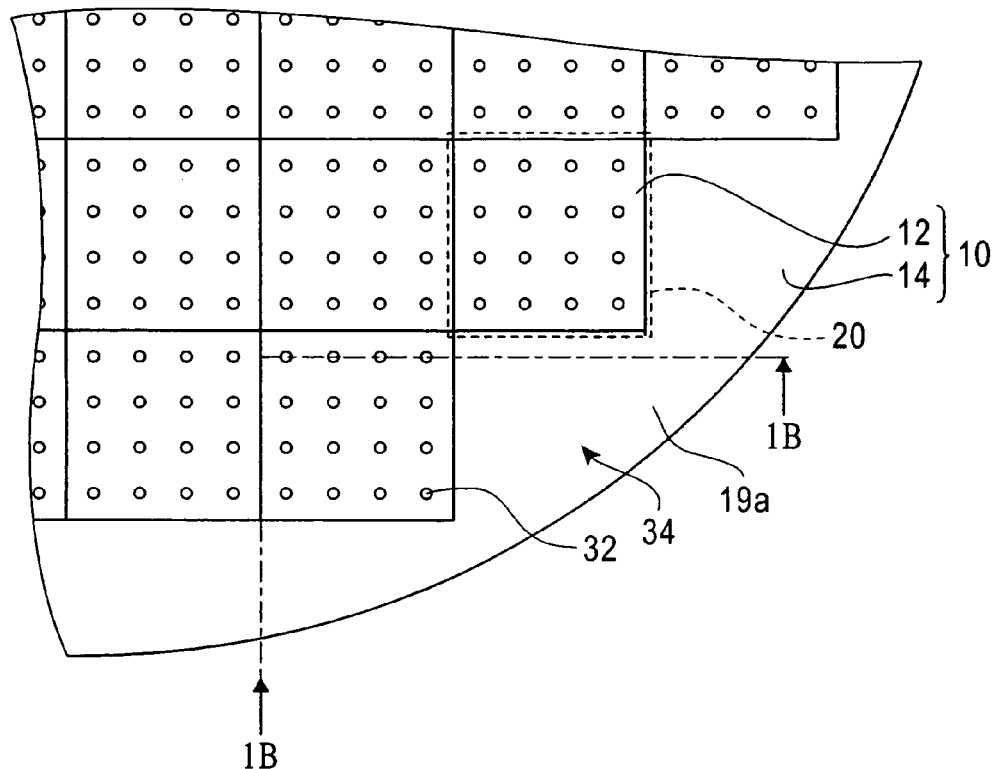
FIG. 1A is a schematic plan view showing some of semiconductor devices obtained by a manufacturing method of this invention.

Now, embodiments of the present invention are described with reference to the accompanying drawings. In the drawings, the shapes, sizes, and positional relationships of the constituent components are schematically illustrated only to an extent facilitating understanding of the invention, and the invention is not particularly limited thereto. In the following description, specific materials, manufacturing conditions, numerical limitations, and similar are used, but these merely indicate preferred examples, and the invention is not limited thereto. In the following description, the same symbols and reference numerals are assigned to similar constituent components even if they are shown in different drawings, and redundant explanations may be omitted.

1. Configuration of a Semiconductor Wafer

First, the configuration of a semiconductor device (semiconductor wafer) manufactured by a manufacturing method of this invention is described with reference to FIGS. 1A and 1B.

Figure 1B:
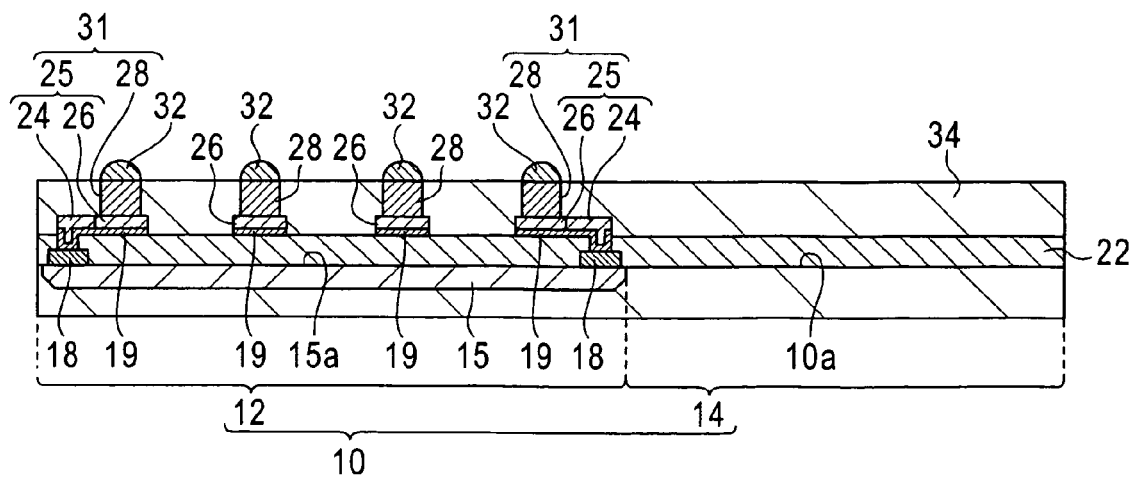
FIG. 1B is a schematic cross-sectional view, taken along the broken line 1B-1B in FIG. 1A.

Referring to FIGS. 1A and 1B, the configuration of semiconductor devices obtained using a manufacturing method of this invention will be described. FIG. 1A shows a portion of the semiconductor wafer region immediately before separation into individual dies, and FIG. 1B shows a cross-sectional view.

Semiconductor devices are formed on the semiconductor wafer 10. A plurality of semiconductor chip formation regions 12 are set on the wafer surface 10a, that is, the main surface, of the semiconductor wafer 10. The semiconductor chip formation regions 12 are the regions in which semiconductor chips are formed. Within the semiconductor chip formation regions 12, a plurality of semiconductor chips are formed. The regions in which individual semiconductor chips are formed, that is, semiconductor chip regions 20, are arranged in a matrix.

The semiconductor wafer 10 has a peripheral region 14. The peripheral region 14 extends along the outer perimeter of the semiconductor wafer 10, surrounding the semiconductor chip formation regions 12. Semiconductor chips are not formed in this peripheral region 14.

The semiconductor wafer 10 includes a region in which circuit devices 15 are formed. These circuit devices 15 are generally a plurality of active devices having LSIs or other integrated circuits.

The surface 15a of a circuit device 15 is coplanar with the main surface 10a of the semiconductor wafer 10.

In a circuit device 15, generally a wiring structure with a plurality of layers (not shown; hereafter also called "internal wiring") is formed, such that a combination of the active devices can operate to realize prescribed functions.

A plurality of electrode pads (hereafter also called circuit device connection pads) 18, connected to circuit devices and wiring structures, are provided on the surface 15a. The circuit device connection pads 18 are provided along the periphery of the semiconductor chip regions 20 such that the pitch (interval) between adjacent circuit device connection pads 18 is constant.

As shown in FIG. 1B, the insulating film 22 is formed on the surface 15a such that some portions of the circuit device connection pads 18 are exposed.

On this insulating film is provided a conducting film (UBM film) 19. The conducting film 19 is provided in the same pattern shape as the wiring structure 31, described below, within the semiconductor chip formation region 12. The conducting film 19 also continuously covers the side walls and bottom face of the aperture portions 22a of the insulating film 22. The circuit device connection pads 18 are exposed in the aperture portions 22a of the insulating film 22.

On the conducting film 19 within the semiconductor chip formation region 12 is provided a wiring structure 31, electrically connected to the circuit device connection pads 18. This wiring structure 31 is connected to the circuit device connection pads 18 in a so-called fan-in design. It should be noted that the connection manner is not limited to the fan-in design. For example, a so-called fan-out wiring may also be employed.

The wiring structure 31 includes protruding electrodes 28 electrically connected to external terminals 32, and a rewiring layer 25 which electrically connects the protruding electrodes 28 to the circuit device connection pads 18. The wiring 24 of this rewiring layer 25 is connected to protruding electrode pads (also called land portions) 26. The protruding electrodes 28 are also called column-shape electrodes. In the illustrated embodiment, the protruding electrodes 28 have a cylindrical shape. The protruding electrodes 28 are provided on the protruding electrode pads 26.

The aperture portions 22a penetrate the insulating film 22 and expose the circuit device connection pads 18. The aperture portions 22a are filled with the wiring 24 via the conducting film 19, and the wiring 24 is electrically connected with the circuit device connection pads 18. The protruding electrode pads 26 are connected with the wiring 24, and extend on the conducting film 19.

On the wiring structure 31 and exposed insulating film 22 is formed a sealing portion 34 so as to bury the protruding electrodes 28. The upper end faces of the protruding electrode portions 28 are exposed from the sealing portion 34.

A plurality of external terminals 32 are connected to the upper ends of the protruding electrode portions 28 exposed from the sealing portion 34. The external terminals 32 may for example be solder balls.

2. Method of Manufacturing Semiconductor Device

An exemplary method of WCSP manufacture of this invention is described in summary with reference to FIGS. 2A, 2B, 2C, 3A, 3B, 3C, 4A and 4B. This manufacturing method is characterized by the process of optical exposure of the resist layer 33 when forming the protruding electrodes 28. Details of this optical exposure process will be described later. In this section of the specification, the overall WCSP manufacturing method is described in summary fashion.

Figure 2A:
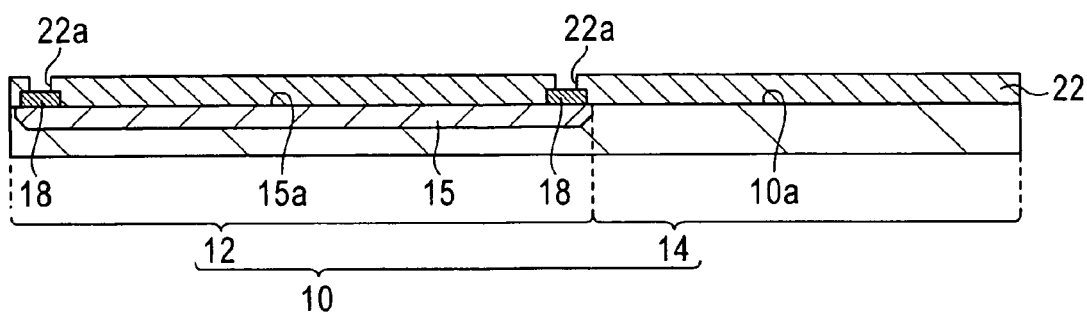
FIG. 2A, FIG. 2B and FIG. 2C are similar to FIG. 1B and show schematic cross-sectional views of a semiconductor wafer during manufacturing, taken along the broken line 1B-1B in FIG. 1A.
Figure 2B:
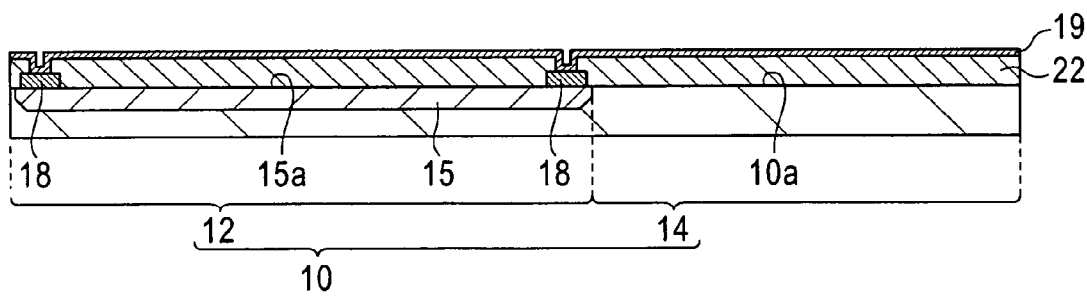
Figure 2C:
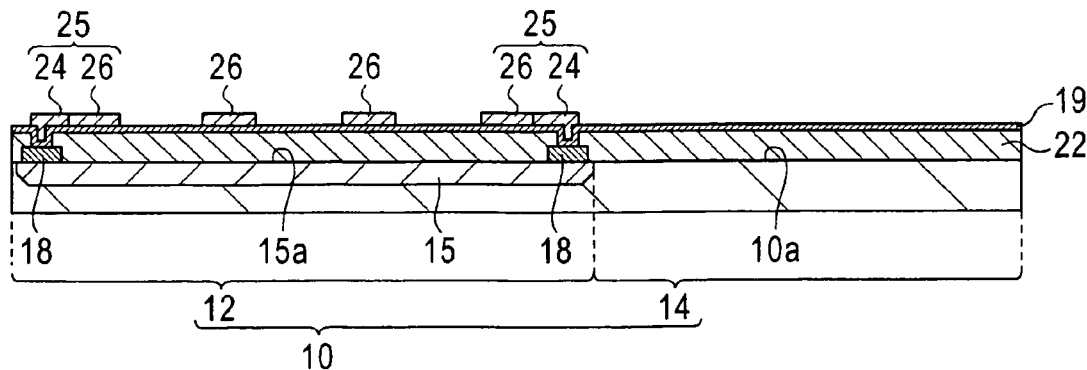

FIG. 2A, FIG. 2B and FIG. 2C are summary views showing the cross-section of a semiconductor wafer during manufacturing, at the same position as the broken line 1B-1B in FIG. 1A.

Figure 3A:
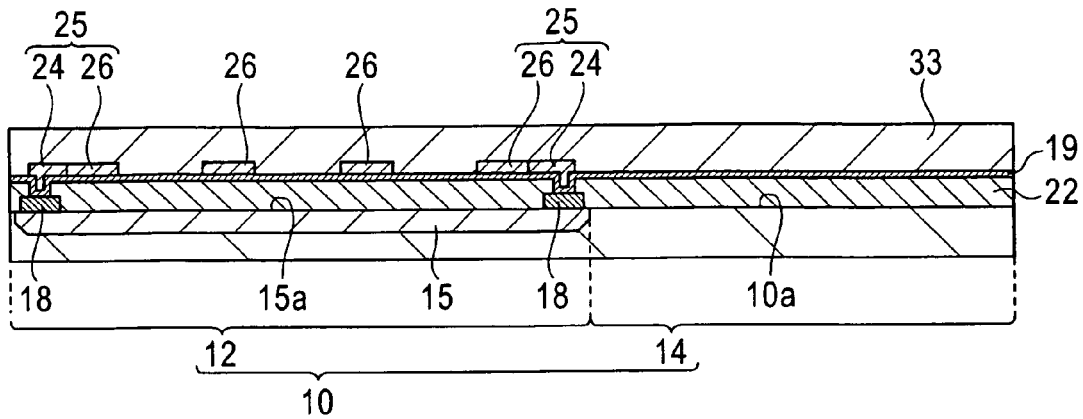
FIG. 3A, FIG. 3B and FIG. 3C are similar to FIG. 2C and show manufacturing processes after FIG. 2C.
Figure 3B:
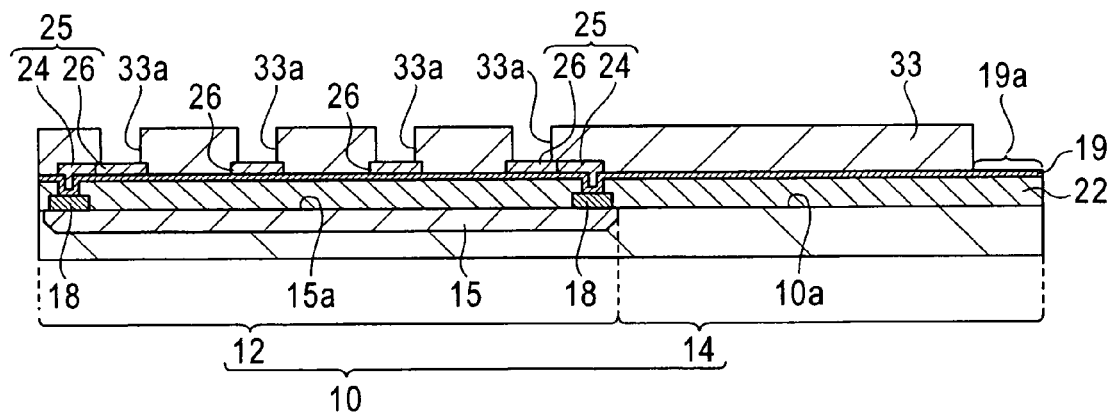
Figure 3C:
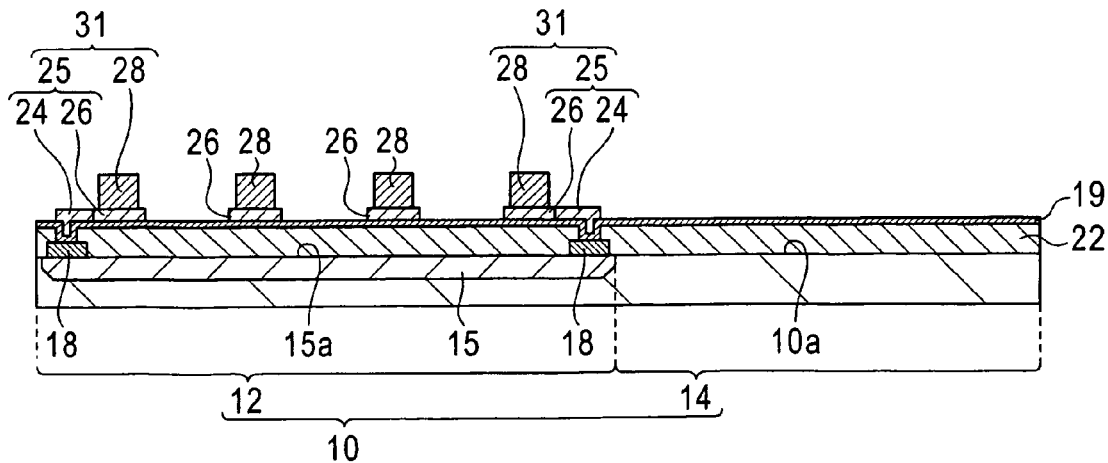
Figure 4A:
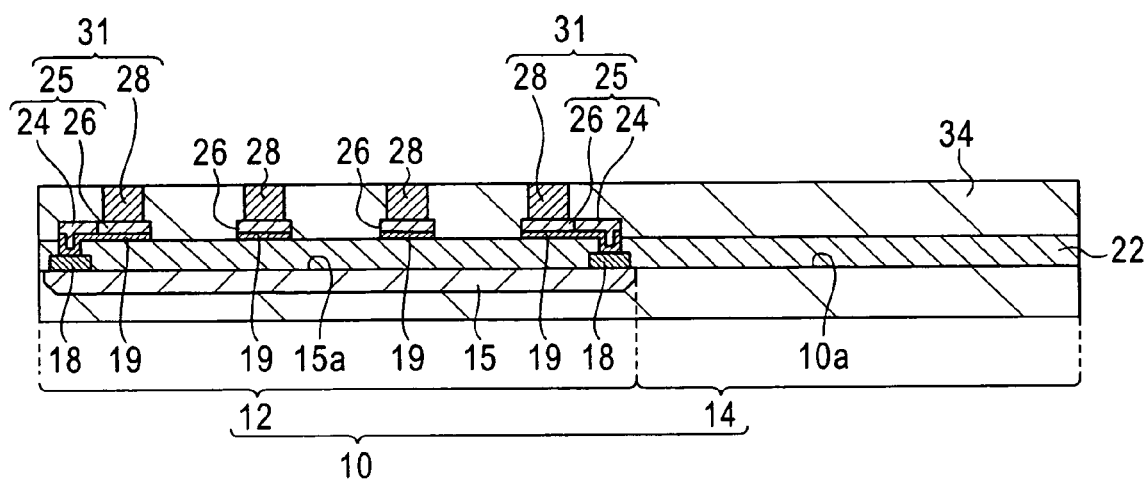
FIG. 4A and FIG. 4B are similar to FIG. 3C and show manufacturing processes after FIG. 3C.
Figure 4B:
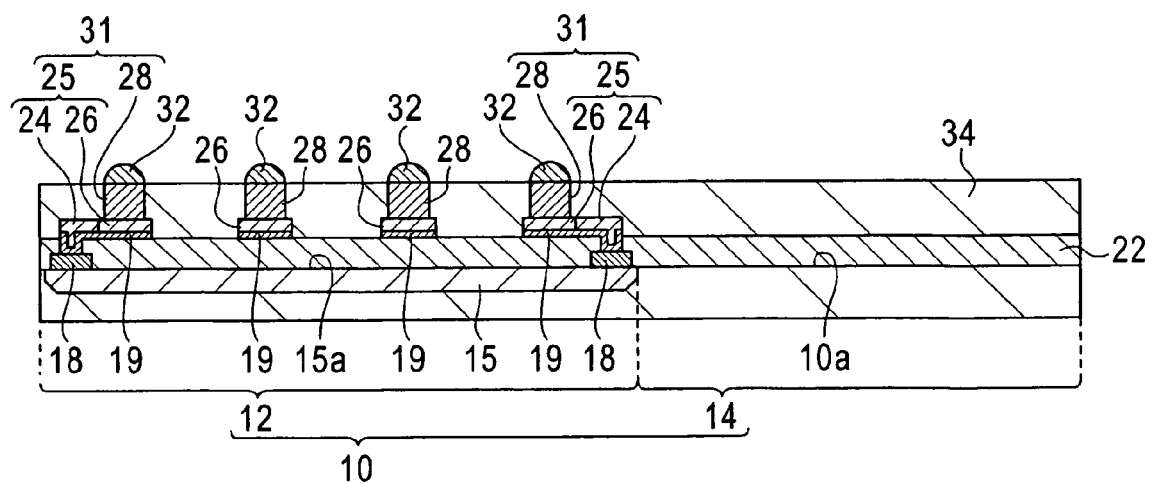

FIG. 3A, FIG. 3B and FIG. 3C show manufacturing processes after FIG. 2C, and FIG. 4A and FIG. 4B show manufacturing processes after FIG. 3C.

As shown in FIG. 2A, a semiconductor chip formation region 12 and a peripheral region 14 surrounding the semiconductor chip formation region 12 are demarcated in advance on the semiconductor wafer 10. The semiconductor wafer 10 is for example a silicon (Si) wafer.

Using normal wafer processes, circuit devices 15 including a plurality of active elements and similar are fabricated in the semiconductor chip formation region 12.

The circuit devices 15 are generally interconnected by a wiring structure (not shown) having a plurality of layers. This multi-layer wiring structure is formed from an Al (aluminum) alloy, an Au (gold) alloy, or similar. The circuit devices 15 are designed to realize prescribed functions.

On the surface 15a of the circuit devices 15 are formed circuit device connection pads 18. The circuit device connection pads 18 are formed from one type of alloy material selected from among, for example, an Al (aluminum) alloy, an Au (gold) alloy, and a Cu (copper) alloy. The materials of the pads 18 are not limited to the above-mentioned alloy materials, but may be any suitable metal(s).

Next, a conventional spin coating method or similar is used to apply a coating of thickness approximately 10 μm of for example a polyimide, as an insulating film, to the entire surface of the semiconductor wafer 10, to form the insulating film 22. The insulating film 22 is formed such that a portion of each of the circuit device connection pads 18 is exposed. It is preferable that the insulating film 22 may have a flat upper surface.

Specifically, for example, after forming the insulating film 22 over the entire surface of the semiconductor wafer 10, a common photolithography technique may be used to form aperture portions 22a extending from the surface of the insulating film 22 to the circuit device connection electrode pads 18, so that a portion of the circuit device connection electrode pads 18 appears at the surface.

Next, as shown in FIG. 2B, a conducting film (UBM film) 19 is formed over the entire surface of the insulating film 22. The conducting film 19 is formed so as to cover the interiors of the aperture portions 22a.

The conducting film 19 can be formed by a conventional sputtering process. Specifically, for example, titanium (Ti) and copper (Cu) are layered in sequence.

Next, as shown in FIG. 2C, a conventional photolithography process is used to form a wiring structure electrically connected to the circuit device connection electrode pads 18. Specifically, first a resist mask (not shown) is formed on the conducting film 19 to form the pattern of the rewiring layer 25 to be formed. After plating processing, the resist mask is removed, to form a wiring layer (rewiring layer 25) having a prescribed pattern.

This wiring layer is formed from the circuit device connection electrode pads 18 toward the center of the semiconductor chip formation region 12, such that the wiring 24 made by the so-called fan-in method and the protruding electrode pads 26 connected to the wiring 24 are included in the rewiring layer 25.

Subsequently, the protruding electrodes 28 are formed on the rewiring layer 25.

First, as shown in FIG. 3A, a resist layer 33 is formed on the rewiring layer 25 and on the conducting layer 19 which is not covered by the rewiring layer 25.

Preferably the material of the resist layer 33 is a negative resist material. In consideration of costs and the required film thickness, a negative resist material with so-called dry film properties is used in this embodiment.

Next, as shown in FIG. 3B, a photolithography process is used to pattern the resist layer 33. Specifically, the resist layer 33 has aperture portions 33a to expose a portion of the protruding electrode pads 26 in the semiconductor chip formation region 12. The resist layer 33 also has a pattern exposing a portion of the conducting film 19 in a plurality of places at the outer edge of the peripheral region 14. That is, a portion of the conducting film 19 positioned at the outer edge of the peripheral region 14 is exposed from the resist layer 33 to form electrode portions 19a. In the plating process for the protruding electrodes 28, these electrode portions 19a are used as electrodes for connection to the plating equipment.

Next, as shown in FIG. 3C, the patterned resist layer 33 is used as a mask in plating processing to form the protruding electrodes 28, by for example using a conventional plating process to plate the conductor copper (Cu). At this time, the plating equipment electrodes are connected to the electrode portions 19a, but the electrode portions 19a are covered by a sealing device of the plating equipment. Hence a plating film is not formed on the electrode portions 19a.

Thus in this manufacturing method, the electrode portions 19a are limited to a portion of the peripheral region 14, and the area can be made small, so that prevention of formation of a plated film by the sealing device of the plating equipment can be easily performed.

Subsequently, the resist layer 33 is removed, and the protruding electrodes 28 are formed.

Next, the conducting film 19 exposed by the rewiring layer 25 is etched and removed under conditions appropriate to the material of the conducting film 19.

Next, as shown in FIG. 4A, a conventional transfer mold method or printing method is employed to form the sealing portion 34, using for example an epoxy mold resin, a liquid sealing material, or another conventional sealing resin material.

Specifically, the sealing resin is injected or applied to the semiconductor chip formation region 12 and peripheral region 14 on the semiconductor substrate 10. The surface of the sealing resin is then subjected to grinding or similar to expose the upper end faces of the protruding electrodes 28 from the sealing portion 34.

Arbitrary appropriate treatment may be performed on the exposed end faces of the protruding electrodes 28 as required by design parameters or conditions. For example, when the material of the protruding electrodes 28 is copper, a conductive metal layer such as a thin nickel (Ni) film may be formed on the end face by the treatment.

Thereafter, as shown in FIG. 4B, the external terminals 32 are formed by a known method such as printing and reflow process, or solder-balls mounting and reflow process.

With this, the semiconductor device packaging at the wafer level is completed.

Next, the semiconductor wafer 10 is cut along scribe lines to obtain separate dies. In this way, a plurality of semiconductor devices having the same structure can be manufactured from a single semiconductor wafer.

3. Optical Exposure Process

The optical exposure process of this invention is described with reference to FIGS. 5A, 5B, 6A and 6B. This embodiment uses a reduced projection exposure process, which is similar to an optical exposure process employing conventional exposure equipment, that is, so-called steppers.

Figure 5A:
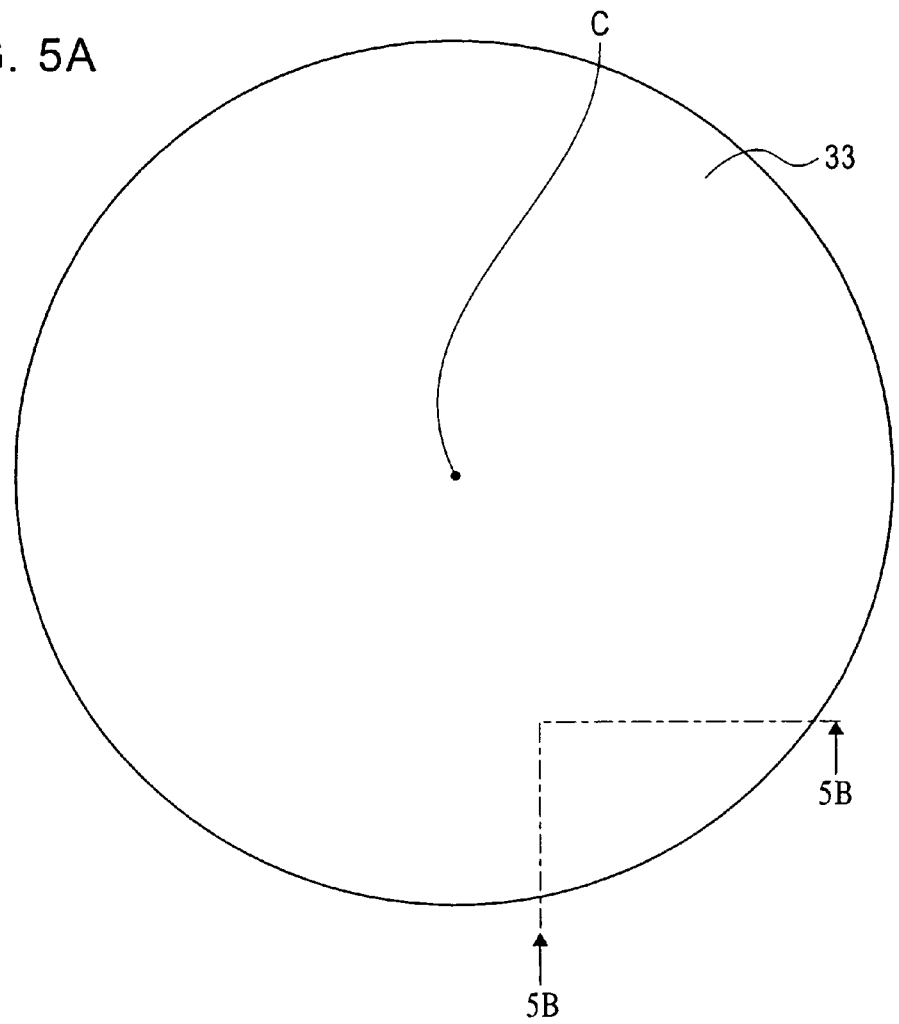
FIG. 5A is a plan view of a semiconductor wafer subject to the optical exposure process.
Figure 5B:
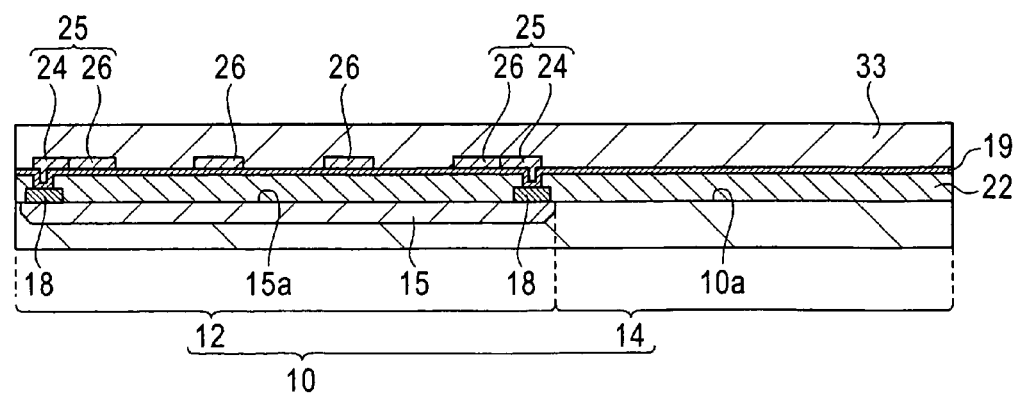
FIG. 5B is a schematic cross-sectional view taken along the broken line 5B-5B in FIG. 5A.

FIG. 5A is a plan view of a semiconductor wafer used to describe the optical exposure process, and FIG. 5B is a schematic cross-sectional view taken along the broken line 5B-5B in FIG. 5A.

Figure 6A:
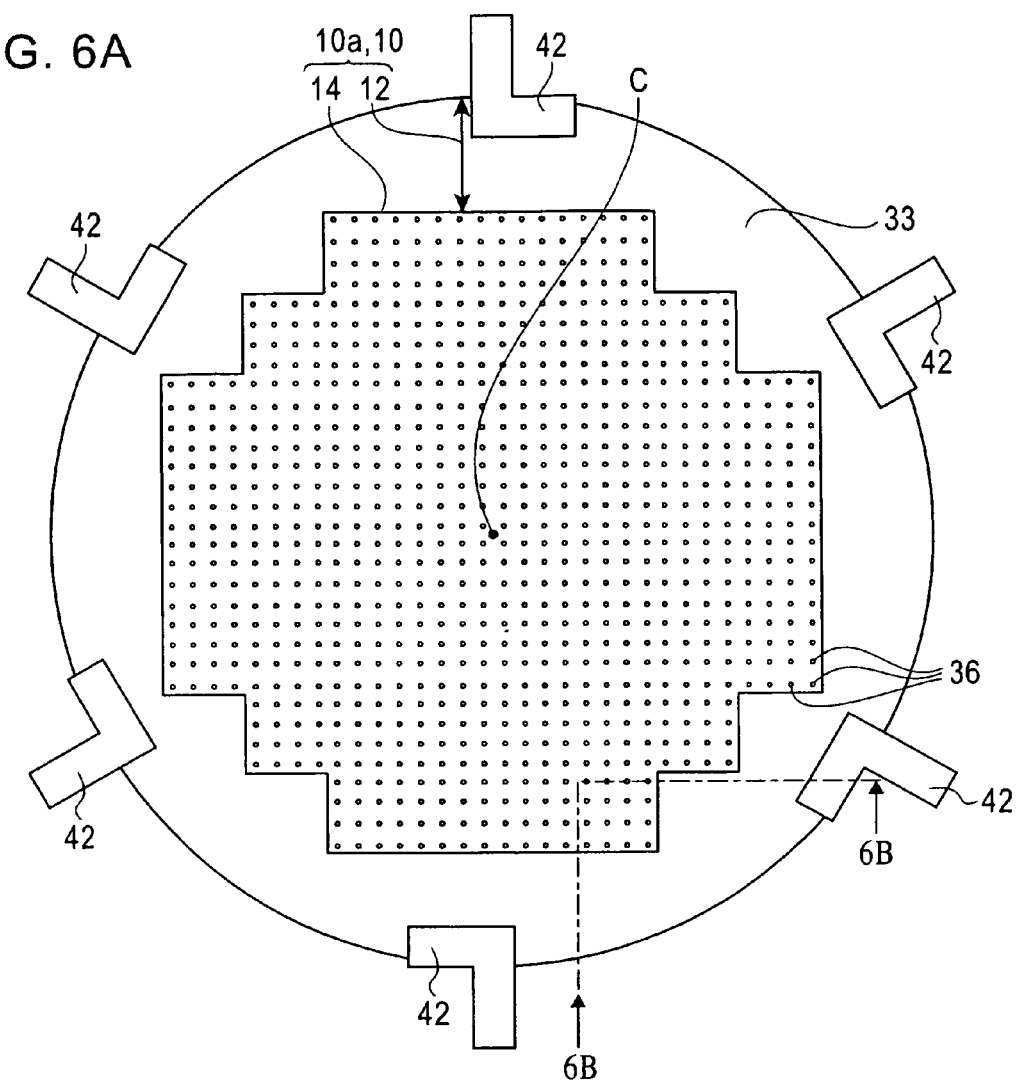
FIG. 6A is a plan view and shows the optical exposure process after FIG. 5B.
Figure 6B:
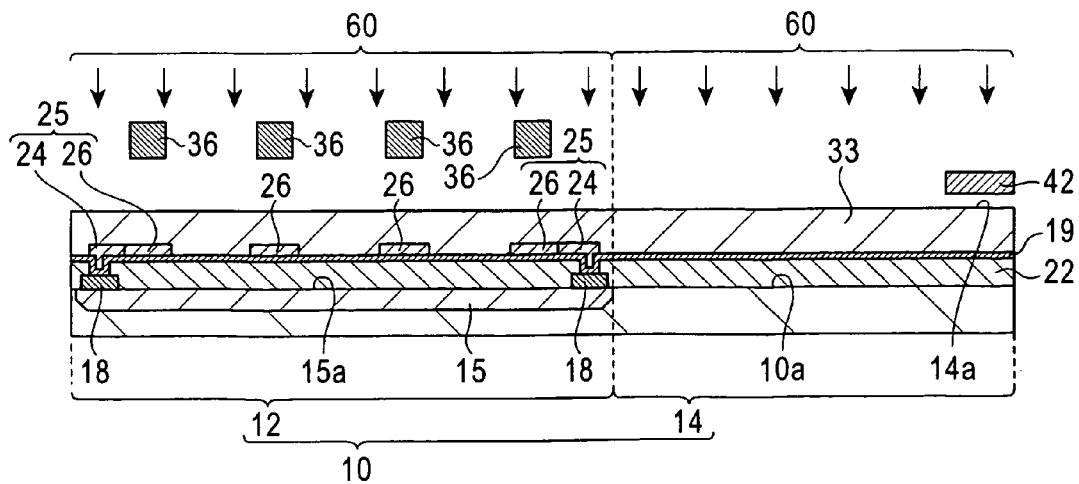
FIG. 6B is a cross-sectional view taken along the line 6B-6B in FIG. 6A.

FIG. 6A shows the optical exposure process after FIG. 5A. FIG. 6B is a cross-sectional view taken along the line 6B-6B in FIG. 6A.

The optical exposure process described here is equivalent to the process described with reference to FIG. 3A and FIG. 3B.

As shown in FIG. 5A and FIG. 5B, a resist layer 33 is formed on the rewiring layer 25 and on the conducting film 19 exposed from the rewiring layer 25. As mentioned above, the resist layer 33 is formed from negative resist material.

Next, as shown in FIG. 6A and FIG. 6B, a shield layer 36 having a pattern which shields regions in which the protruding electrodes 28 are formed (protruding electrode formation regions) is set in the optical exposure apparatus. It is preferable that this shield layer 36 be fabricated, for example, by forming and patterning a thin film of low-reflectivity chromium on quartz glass.

Thereafter, the semiconductor wafer 10 is fixed in place in the exposure apparatus. At this time, the electrode blinds 42 are positioned directly above the peripheral region 14 of the semiconductor wafer 10, to cover a portion of the peripheral region 14. The electrode blinds 42 are not in contact with the peripheral region 14 of the semiconductor wafer 10, as clearly illustrated in FIG. 6B.

As shown in FIG. 6A, in this embodiment, six electrode blinds 42 are provided and spaced from each other at equal intervals (equal angles of 60°).

Next, using the shield layer 36 and the blind members 43 covering a portion of the peripheral region 14 as optical exposure masks, a beam 60 of appropriate wavelength and dose is irradiated, to execute optical exposure of the wafer surface 10a of the semiconductor wafer 10.

In this optical exposure processing, the stepper is used to perform so-called shot exposure. That is, the image obtained from the shield layer 36 is reduced by a projection lens (not shown) positioned between the shield layer 36 and the semiconductor substrate 10, to perform optical exposure by projection onto a region equivalent to one chip in the semiconductor chip formation region. When the optical exposure ends, the semiconductor substrate 10 is moved using the stage (not shown), and the next region, for example equivalent to an adjacent chip, is exposed; in this manner, a plurality of demarcated regions are scanned and individually subjected to shot exposure.

In the optical exposure process of this embodiment, optical exposure is also performed in the peripheral region 14. That is, shot exposure is performed for each of a plurality of demarcated partial regions in the peripheral region 14. In this optical exposure of the peripheral region 14, partial regions covered by the blind members 43 are not subjected to optical exposure.

By means of this optical exposure process, the resist layer 33 is hardened except for the regions in which an image is projected by the shield layer 36 and the regions covered by the blind members 43. Regions directly below the shield layer 36 and blind members 43 are removed in a development process. That is, through this process partial regions of the resist layer 33 which are covered by the blind members 43 are removed, and the conducting film 19 is exposed. The conducting film 19 thus exposed at the surface then serves as electrode portions 19a.

The resist layer 33 thus patterned is used as a mask, and the electrode portions 19a are used as electrodes, to execute the plating process of FIG. 3B.

4. Optical Exposure Apparatus 4-1-1 First Example

A first example of an optical exposure apparatus of this invention, and the operation thereof, is described with reference to FIGS. 7A, 7B and 7C.

Figure 7A:
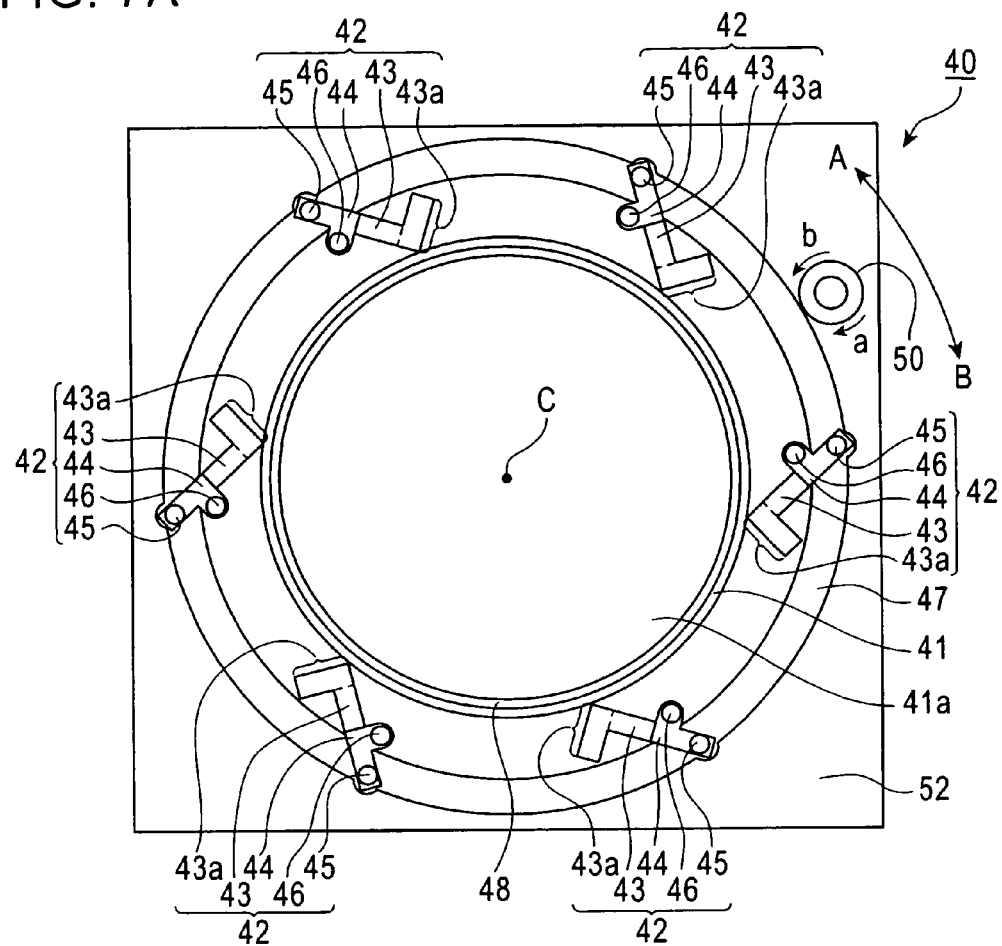
FIG. 7A is a schematic plan view of the optical exposure apparatus.
Figure 7B:
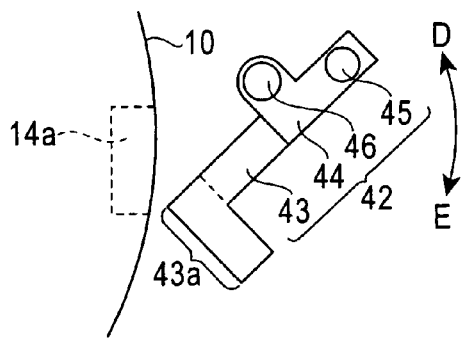
FIG. 7B is a schematic plan view of an exemplary blind member in a non-shading position.
Figure 7C:
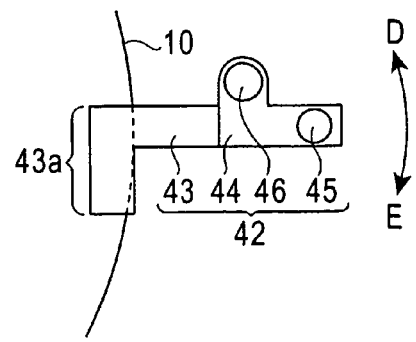
FIG. 7C is a schematic plan view of the blind member in a shading position.

FIG. 7A is a schematic plan view used to describe the configuration of the optical exposure apparatus, and FIG. 7B and FIG. 7C are schematic plan views used to describe the configuration and operation of blind members.

The optical exposure apparatus 40 has an XY-axis driven stage 52. The XY-axis driven stage 52 possesses a conventional structure. This XY-axis driven stage 52 is provided with a platen (wafer holder) 41. The platen 41 can have an appropriate conventional configuration, formed for example from aluminum or some other material.

A semiconductor wafer 10 is placed on the platen 41. The platen 41 has a wafer-holding region 41*a* in contact with the wafer 10 to hold the wafer 10. The shape and size of the wafer-holding region 41*a* can be decided arbitrarily as appropriate, taking into consideration the shape, size and similar of the semiconductor wafer 10 to be held. In this example, the wafer-holding region 41*a* is substantially circular, and its center is denoted by C.

Within the wafer-holding region 41*a*, a wafer suction portion 48 is provided which holds the semiconductor wafer 10 by suction. This wafer suction portion 48, for example, is a conventional vacuum suction device which holds the semiconductor wafer 10 in the wafer-holding region 41*a* by suction.

An optical exposure apparatus 40 has a driving ring 47. The driving ring 47 is a closed-loop member surrounding the center point C. The material of the driving ring 47 can be selected arbitrarily as appropriate, on condition of having sufficient strength to actuate the electrode blinds, described below.

The driving ring 47 has a circular outline, having a diameter larger than that of the wafer-holding region 41*a*. The driving ring 47 is spaced from the wafer-holding surface 41*a* of the platen 41. The driving ring 47 can rotate in the directions of arrow A and arrow B about the center point C, which coincides with the center point of the semiconductor wafer.

The electrode blinds 42 are connected to the driving ring 47.

As shown in FIG. 7B and FIG. 7C, the electrode blinds 42 have blind members 43. In this example, the blind members 43 have an L-shape. The tip portion of each blind member 43 is a shield region 43*a*. The shape and size of the shield region 43*a* may be decided according to the shape and size of the electrode portion 19*a* to be formed. Preferably the blind members 43 may be formed from aluminum (Al) or some other metal plate which undergoes little thermal deformation and is highly resistant to corrosion. It is preferable that the thickness of each blind member 43 be 0.5 mm or less, in consideration of contrast in the optical exposure process.

In order not to impede the optical exposure process, that is, to prevent diffuse reflection of light, it is preferable that black coloring having no gloss be applied. This coloring may for example be applied through quenching, application of paint, or other conventional manner.

As shown in FIG. 7C, during the optical exposure process, the shield regions 43*a* of the blind members 43 are directly above and cover the electrode portion formation regions 14*a* defined in the peripheral region 14 of the semiconductor wafer 10.

The blind members 43 are connected to mounting members 44. The mounting members 44 are used to mount the electrode blinds 42 on the platen 41 and driving ring 47. The mounting members 44 include driving ring mounting members 45. The driving ring mounting members 45 fix the mounting members 44 in place on the driving ring 47. The mounting members 44 are rotatably fixed to the driving ring 47.

The mounting members 44 also have stage mounting members 46. The stage mounting members 46 fix the mounting members 44 in place on the XY-axis driven stage 52. The stage mounting members 46 fix the mounting members 44 to the XY-axis driven stage 52 in a manner enabling free rotation in the directions of arrow D and arrow E about the stage mounting members 46. The stage mounting members 46 include, for example, a driving portion having a radial bearing and a driving shaft having a flange structure. The stage mounting members 46 may have a conventional bearing structure.

A driving ring actuation unit 50 is provided abutting the driving ring 47 to drive the driving ring 47 in the directions of arrow A and arrow B. The driving ring actuation unit 50 may be a conventional DC motor. The driving ring actuation unit 50 transfers a driving force either directly or indirectly to the driving ring 47 when the driving ring actuation unit 50 itself or a part of the driving ring actuation unit 50 rotates in the directions of the arrows a and b, to drive the driving ring 47 in the directions of arrow A or arrow B.

4-1-2 Operation of the First Example

The operation of the optical exposure apparatus 40 is described with reference to the FIG. 7B, FIG. 7C, FIG. 8A, and FIG. 8B.

Figure 8A:
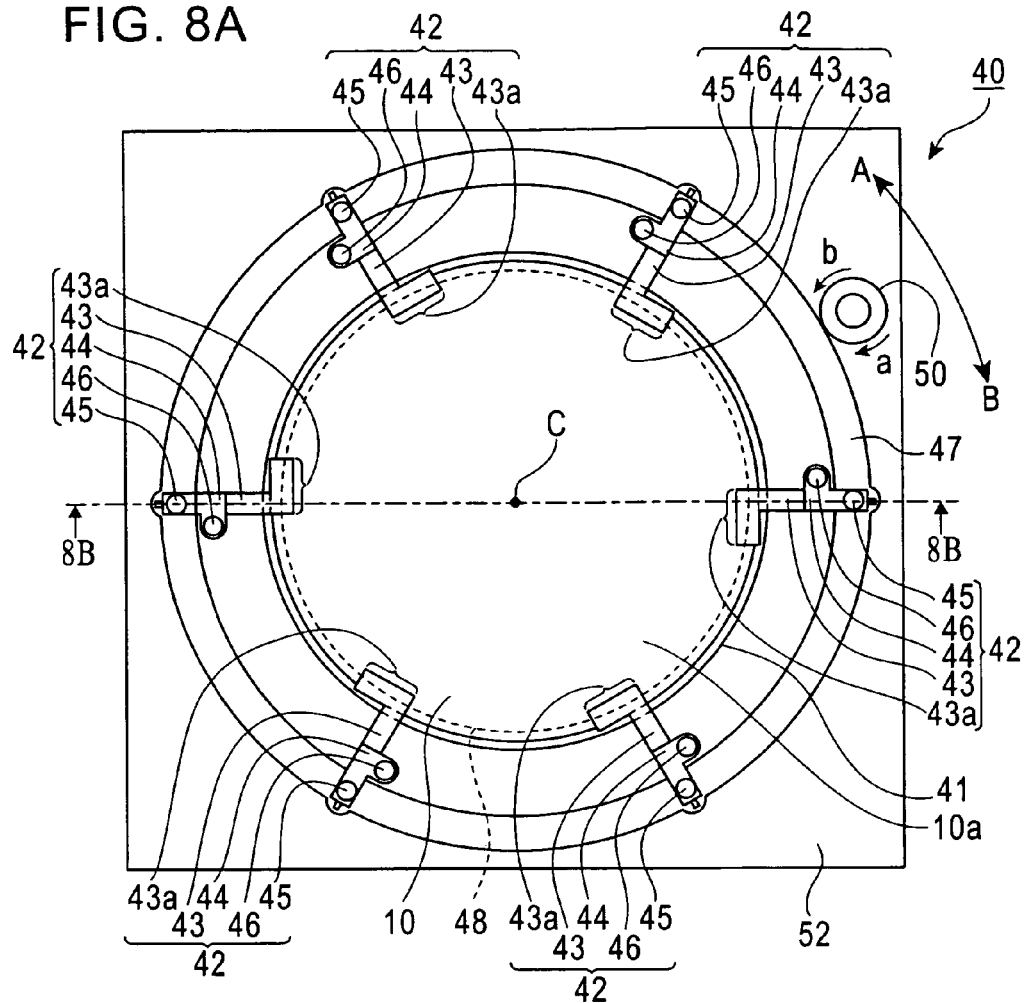
FIG. 8A is a schematic plan view when a semiconductor wafer is retained in the optical exposure apparatus.
Figure 8B:
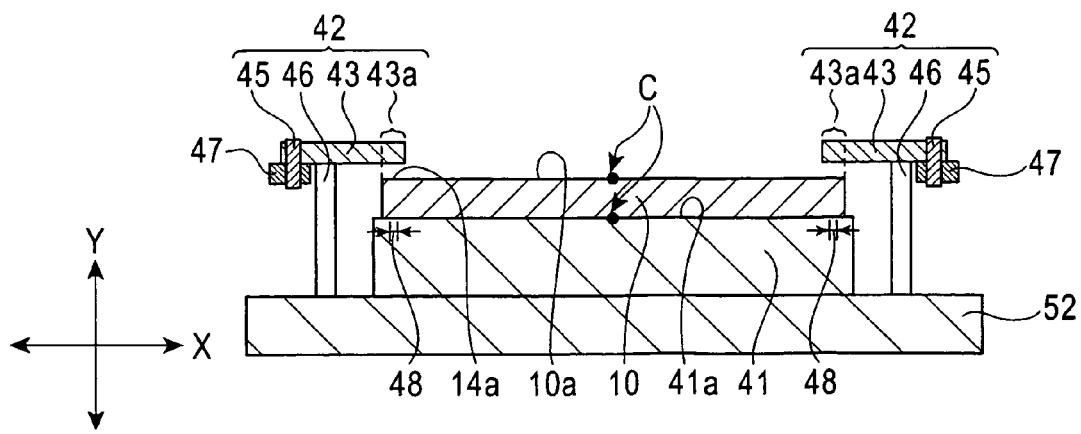
FIG. 8B is a schematic cross-sectional view, taken along the broken line 8B-8B in FIG. 8A.

FIG. 8A is a plan view showing the semiconductor wafer 10 retained in the optical exposure apparatus 40, and FIG. 8B is a cross-sectional view taken along the broken line 8B-8B in FIG. 8A.

As shown in FIG. 7B, electrode portion formation regions 14*a* are set within the peripheral region 14 of the semiconductor wafer 10. When retaining the semiconductor wafer 10 against the platen 41, the shield regions 43*a* of the blind members 43 are positioned directly above these electrode portion formation regions 14*a*, as shown in FIG. 7C.

As shown in FIG. 7A, the driving ring actuation unit 50 is actuated to generate a driving force in the direction of arrow a, so as to cause the driving ring 47 to rotate in the direction of arrow A. Then, as shown in FIG. 7B, the electrode blinds 42 rotate in the direction of arrow D with the stage mounting members 46 as axes of rotation (fulcrums). Through this action, the shield regions 43*a* are positioned above the XY-axis driven stage 52 outside the platen 41. This position of the electrode blinds 42 is hereafter also simply called the open position (first position).

When the electrode blinds 42 are positioned in this open position, the semiconductor wafer 10 is removed from the optical exposure apparatus 40.

As shown in FIG. 8A and FIG. 8B, first the surface opposite the surface 10*a* which is the optical exposure surface of the semiconductor wafer 10 is placed against the wafer-holding region 41*a* of the platen 41. At this time, the wafer suction unit 48 is operated to hold the semiconductor wafer 10 against the platen 41 by suction.

As shown in FIG. 7C and FIG. 8A, the driving ring drive unit 50 is actuated in the direction of arrow b from the open position, thereby causing the driving ring 47 to rotate in the direction of arrow B. Then, as shown in FIG. 7C, the electrode blinds 42 rotate in the direction of arrow E about the stage mounting members 46. By means of this operation, the shield regions 43*a* are positioned directly above the wafer-holding regions 41*a* on which the semiconductor wafer 10 is placed (this position of the electrode blinds 42 is hereafter also called simply the retention position (second position)).

As shown in FIG. 8B, the XY-axis driven stage 52 can move freely in the direction of arrow X and in the direction of arrow Y. Hence by operating the XY-axis driven stage 52, the distance between the shield regions 43*a* and the wafer surface 10*a* can be adjusted to an appropriate distance.

That is, through the principle of lever action, the electrode blinds 42 perform this operation by transmission of the rotating action of the driving ring 47, with the driving ring mounting members 45 as points of force application, to the shield regions 43*a* which are action points through the stage mounting members 46 acting as fulcrums.

Thereafter, the wafer 10 is subjected to a prescribed optical exposure process. The electrode portion formation regions 14*a* masked by the shield regions 43*a* are not optically exposed. Hence in the development process, the resist layer 33 in the electrode portion formation regions 14*a* which are not optically exposed is removed, and electrode portions 19*a* are formed in these regions.

4-2-1 Second Example

Figure 9A:
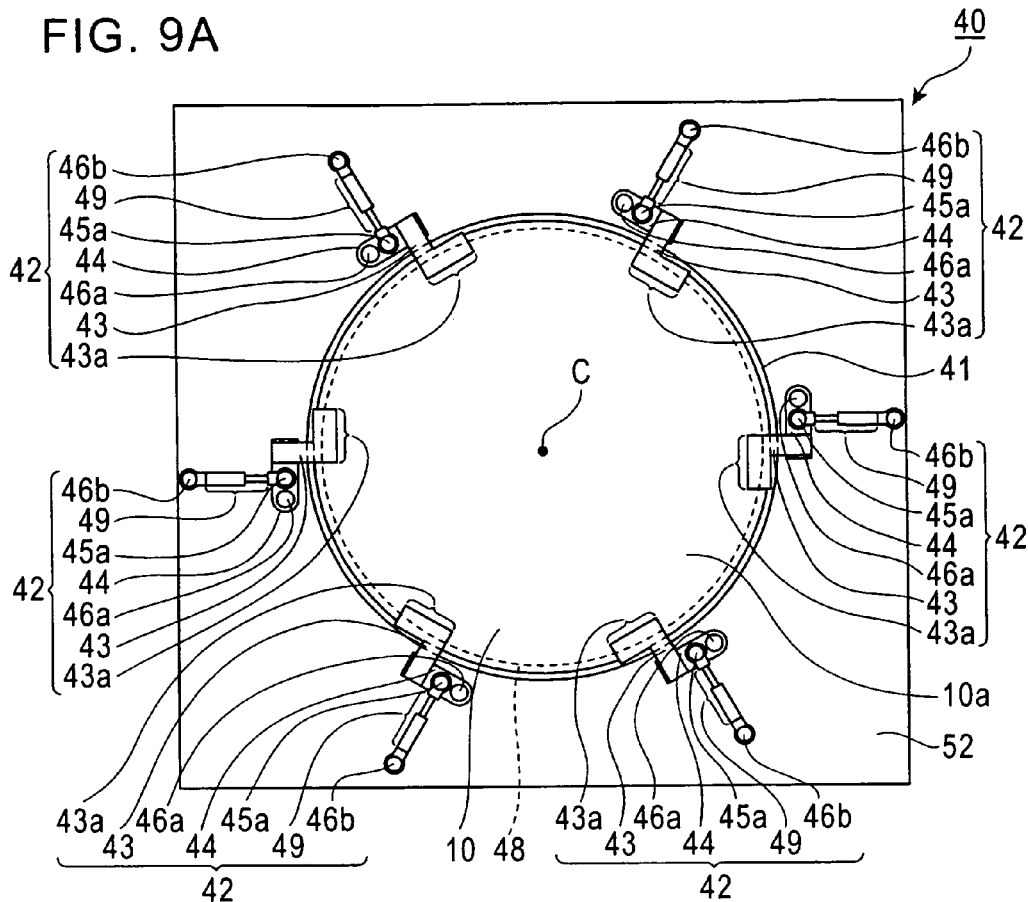
FIG. 9A is a schematic plan view of the optical exposure apparatus according to another embodiment.
Figure 9B:
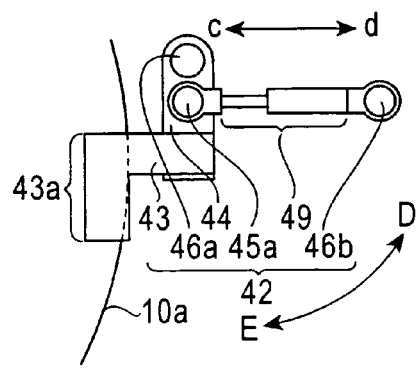
FIG. 9B is a schematic plan view of a blind member of the optical exposure apparatus of FIG. 9A in a shading position.
Figure 9C:
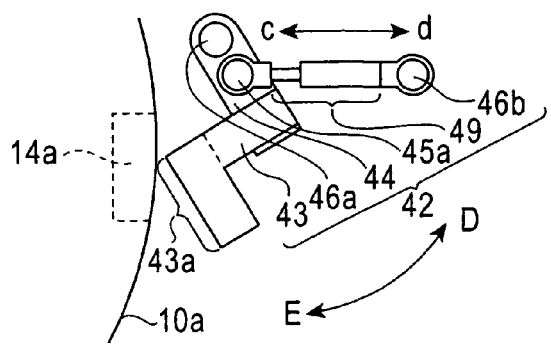
FIG. 9C is a schematic plan view of the blind member in a non-shading position.

A second example of an optical exposure apparatus of this invention, and the operation thereof, are described referring to FIGS. 9A, 9B and 9C.

FIG. 9A is a schematic plan view used to describe the configuration of the optical exposure apparatus, and FIG. 9B and FIG. 9C are schematic plan views used to describe the configuration and operation of blind members.

The optical exposure apparatus 40 of this second example is characterized by the configuration and mechanism for driving the electrode blinds 42. Hence other constituent components are similar to those of the above-described first example shown in FIGS. 7A to 8C, and so a detailed explanation is omitted.

The optical exposure apparatus 40 includes an XY-axis driven stage 52. A platen 41 is provided on the XY-axis driven stage 52. On this platen 41 are provided electrode blinds 42.

The electrode blinds 42 have blind members 43. Each blind member 43 has a shield element 43*a* at the end thereof. In this example, each blind member 43 has an L-shape.

As shown in FIG. 9A, FIG. 9B and FIG. 9C, during the optical exposure process the shield regions 43*a* of the blind members 43 are directly above and cover the electrode portion formation regions 14*a* which will be in the peripheral region 14 of the semiconductor wafer 10.

The blind members 43 are connected to mounting members 44. The mounting members 44 are used to mount the electrode blinds 42 onto the XY-axis driven stage 52. Each mounting member 44 has a round end element 45*a*. This end element 45*a* fixes the mounting member 44 to one end of an expansion/contraction element 49 such that the mounting member 44 can rotate with respect to the expansion/contraction element 49.

Each mounting member 44 has a first stage mounting member 46*a*. The first stage mounting member 46*a* fixes the mounting member 44 in place on the XY-axis driven stage 52.

A second stage mounting member 46*b* is provided on one end of the expansion/contraction element 49. The other end of the expansion/contraction element 49 is connected to the mounting member 44. The second stage mounting members 46*b* fix the mounting members 44 in place on the XY-axis driven stage 52. The first and second stage mounting members 46*a* and 46*b* may have a similar configuration to the stage mounting members 46.

The expansion/contraction elements 49 can expand and contract in the directions of arrows c and d. The expansion/contraction elements 49 can be, for example, conventional pen cylinders. It is preferable that such pen cylinders be configured as cylinders operated by pneumatic pressure.

Thus, because the electrode blinds 42 are actuated by the expansion/contraction elements 49, the wafer optical exposure process can be executed in an apparatus with a simpler construction. If the expansion/contraction elements 49 are actuated by pneumatic pressure, the control system circuitry for the expansion/contraction elements 49 can be simplified. This reduces semiconductor device manufacturing costs.

4-2-2 Operation of the Second Example

The operation of the second configuration example is described, referring to FIG. 9A, FIG. 9B and FIG. 9C.

As shown in FIG. 9C, electrode portion formation regions 14*a* are set within the peripheral region 14 of the semiconductor wafer 10. When optically exposing the semiconductor wafer 10, the shield regions 43*a* of the blind members 43 are positioned directly above the electrode portion formation regions 14*a*, as shown in FIG. 9B.

As shown in FIG. 9C, the expansion/contraction elements 49 are driven to contract the total length of the expansion/contract elements 49 in the direction of arrow d. As a result, the electrode blinds 42 rotate in the direction of arrow D with the first stage mounting members 46*a* as the rotation axis (fulcrum). Through this operation, the shield regions 43*a* are positioned above regions other than the wafer-holding region 41*a* on which the semiconductor wafer 10 is placed, that is, above the XY-axis driven stage 52. In this way the electrode blinds 42 are moved to the open position (first position).

When the electrode blinds 42 are positioned in this open position, a semiconductor wafer 10 can be placed in and removed from the optical exposure apparatus 40.

As shown in FIG. 9A and FIG. 9B, first the surface of the semiconductor wafer 10 opposite the surface 10*a*, which is the surface for optical exposure, is placed against the wafer-holding region 41*a* of the platen 41 (see FIG. 7A).

Then, the expandable and shrinkable elements 49 are actuated in the direction of arrow c from the open position (FIG. 9C), thereby causing the total length of the elements 49 to expand. As a result the electrode blinds 42 rotate in the direction of arrow E about the first platen mounting members 46*a*. Through this rotation operation, the shield regions 43*a* are positioned directly above the wafer-holding region 41*a* on which the semiconductor wafer 10 is placed.

As described using FIG. 8B, through operation of the XY-axis driven stage 52, the shield regions 43*a* are spaced an appropriate distance from the wafer-holding region 41*a*.

Thereafter, as described above, the wafer 10 is subjected to a predetermined optical exposure process. At this time, the electrode portion formation regions 14*a* masked by the shield regions 43*a* are not optically exposed. Hence in the development process the resist layer 33 is removed in the electrode portion formation regions 14*a* not subjected to optical exposure, and electrode portions 19*a* are formed in these regions.

This application is based on a Japanese Patent Application No. 2004-243832 filed on Aug. 24, 2004, and the entire disclosure thereof is incorporated herein by reference.

What is claimed is:

1. An optical exposure apparatus, comprising:
an XY-axis driven stage;
a platen provided on said XY-axis driven stage for holding a semiconductor wafer;
a driving ring, in a closed-loop shape, which rotates about a center point of said driving ring, and,
a plurality of electrode blinds, connected to said driving ring and to said XY-axis driven stage, which in response to rotation of said driving ring can move between
a first position in which said semiconductor wafer can be placed onto and removed from said platen, and
a second position in which said plurality of electrode blinds extend over a peripheral region of the semiconductor wafer placed on said platen, so as to cover a plurality of portions of the peripheral region, so that the covered plurality of portions of the peripheral region are not exposed during an exposing process, the electrode blinds being not in contact with the covered plurality of portions of the peripheral region of the semiconductor wafer.

2. The optical exposure apparatus according to claim 1, wherein said plurality of electrode blinds are colored black.

3. An optical exposure apparatus, comprising:
an XY-axis driven stage;
a platen provided on said XY-axis driven stage for holding a semiconductor wafer; and,
a plurality of electrode blinds, connected to said XY-axis driven stage, which can move between
 a first position in which said semiconductor wafer can be placed onto and removed from said platen and
 a second position in which said plurality of electrode blinds extend over a peripheral region of said semiconductor wafer placed on said platen, so as to cover a plurality of portions of the peripheral region, so that the covered plurality of portions of the peripheral region are not exposed during an exposing process, the electrode blinds being not in contact with the covered plurality of portions of the peripheral region of the semiconductor wafer; and
wherein each said electrode blind is actuated between said first position and said second position by an expandable and shrinkable element.

4. The optical exposure apparatus according to claim 3, wherein said expandable and shrinkable element is actuated pneumatically.

5. The optical exposure apparatus according to claim 3, wherein said plurality of electrode blinds are colored black.

6. The optical exposure apparatus according to claim 1, wherein said plurality of portions of the semiconductor wafer that are blinded by said plurality of electrode blinds are areas in which electrodes of the semiconductor will be provided.

7. The optical exposure apparatus according to claim 1, wherein said XY-axis driven stage can move vertically to adjust a distance between said semiconductor wafer and said plurality of electrode blinds.

8. The optical exposure apparatus according to claim 3, wherein said plurality of portions of the semiconductor wafer that are blinded by said plurality of electrode blinds are areas in which electrodes of the semiconductor will be provided.

9. The optical exposure apparatus according to claim 3, wherein said XY-axis driven stage can move vertically to adjust a distance between said semiconductor wafer and said plurality of electrode blinds.

10. An optical exposure apparatus for use in a method of manufacturing a semiconductor device, said manufacturing method comprising the steps of:
 (a) setting, on a main surface of a semiconductor wafer, a semiconductor chip formation region and a peripheral region surrounding said semiconductor chip formation region;
 (b) forming, within said semiconductor chip formation region, a circuit device and a plurality of electrode pads for connection to said circuit device;
 (c) forming, on said main surface, an insulating film which exposes a portion of each of said plurality of electrode pads;
 (d) forming, on said insulating film, a conducting film covering said plurality of electrode pads;
 (e) forming a wiring layer on said conducting film;
 (f) forming a negative resist layer over said wiring layer and said peripheral region;
 (g) optically exposing and patterning said negative resist layer, using a shielding layer to optically shield protruding electrode formation regions defined on said wiring layer and using an optical exposure apparatus having a plurality of electrode blinds which optically shield a plurality of electrode formation regions in said peripheral region, so as to form aperture portions in said protruding electrode formation regions to expose a portion of said wiring layer and so as to expose said conducting film at a plurality of locations to form a plurality of electrode portions; and
 (h) executing a plating step, using as a mask said patterned resist layer having said aperture portions, to form protruding electrodes in said protruding electrode formation regions.

11. The optical exposure apparatus according to claim 10, wherein said negative resist layer has a dry film property.

12. The optical exposure apparatus according to claim 10, wherein the optical exposure apparatus includes:
an XY-axis driven stage;
a platen provided on said XY-axis driven stage for holding the semiconductor wafer;
a driving ring, in a closed-loop shape, which rotates about a center point of said closed loop; and,
said plurality of electrode blinds, connected to said driving ring and to said XY-axis driven stage, which in response to rotation of said driving ring can move between a first position in which said semiconductor wafer can be placed onto and removed from said platen and a second position in which said plurality of electrode blind extend over a plurality of portions of said peripheral region of the semiconductor wafer placed on said platen for not exposing said plurality of portions during an exposing process.

13. The optical exposure apparatus according to claim 10, wherein said plurality of electrode blinds are colored black.

14. The optical exposure apparatus according to claim 10, wherein the optical exposure apparatus includes:
an XY-axis driven stage;
a platen provided on said XY-axis driven stage for holding the semiconductor wafer; and,
said plurality of electrode blinds, connected to said XY-axis driven stage, which can move between a first position in which said semiconductor wafer can be placed onto and removed from said platen and a second position in which said plurality of electrode blind extend over a plurality of portions of said peripheral region of the semiconductor wafer placed on said platen for not exposing said plurality of portions during an exposing process; and wherein each said electrode blind is actuated between said first position and said second position by an expandable and shrinkable element.

15. The optical exposure apparatus according to claim 14, wherein said expandable and shrinkable element is actuated pneumatically.

16. The optical exposure apparatus according to claim 14, wherein said plurality of electrode blinds are colored black.

* * * * *